Figure 1:
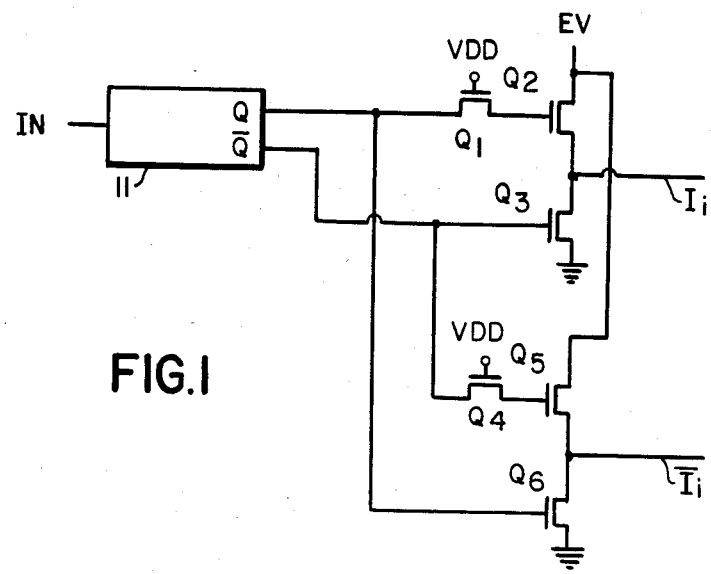

United States Patent [19]

Mahmud

[11] Patent Number: 4,636,661

[45] Date of Patent: Jan. 13, 1987

[54] RATIOLESS FET PROGRAMMABLE LOGIC ARRAY

[75] Inventor: Syed T. Mahmud, Los Gatos, Calif.

[73] Assignee: Signetics Corporation, Sunnyvale, Calif.

[21] Appl. No.: 684,638

[22] Filed: Dec. 21, 1984

[51] Int. Cl.$^4$ ............... H03K 19/177; H03K 19/094; H03K 19/003

[52] U.S. Cl. .................... 307/468; 307/443; 307/482; 307/594; 307/481

[58] Field of Search ............ 307/448, 465, 468, 469, 307/481, 482, 578, 594, 597, 443; 364/716

[56] References Cited

U.S. PATENT DOCUMENTS

| | | | |
|---|---|---|---|
| 3,943,377 | 3/1976 | Suzuki | 307/469 X |
| 4,040,015 | 8/1977 | Fukuda | 307/481 X |
| 4,291,247 | 9/1981 | Cooper, Jr. et al. | 307/481 |
| 4,295,064 | 10/1981 | Schuster | 307/468 |
| 4,501,977 | 2/1985 | Koike | 307/481 X |

FOREIGN PATENT DOCUMENTS

| | | | |
|---|---|---|---|
| 2544434 | 4/1977 | Fed. Rep. of Germany | 307/481 |
| 2853517 | 6/1979 | Fed. Rep. of Germany | 307/443 |

OTHER PUBLICATIONS

Wood, "High-Speed Dynamic Programmable Logic Array Chip"; IBM J. Res. Develop.; 7/1975; pp. 379-383.

Primary Examiner—Larry N. Anagnos
Attorney, Agent, or Firm—Robert T. Mayer

[57] ABSTRACT

A ratioless, zero d.c. power dissipating FET programmable logic array including a column boost capacitor for maintaining the columns of selected AND array transistors at approximately their precharged voltage while their associated OR array transistors are being evaluated.

8 Claims, 3 Drawing Figures

RATIOLESS FET PROGRAMMABLE LOGIC ARRAY

This is an invention in integrated circuits. More particularly, the invention is a novel programmable logic array.

Programmable logic arrays are arranged in two matrices usually referred to as the AND and OR matrices or the AND and OR arrays. These are connected by vertical and horizontal conductors called columns and rows. Field effect transistor (FET) programmable logic arrays (PLAs) have been made with a resistance ratio between their input and their load transistors. These usually operate by precharging only one array, either the AND array along the vertical column conducting lines or the OR array along the horizontal row conducting lines. FET PLAs are also known which operate by precharging both the AND array and the OR array but these require multiple clock signals and/or additional logic circuitry between the AND and OR arrays to operare properly.

It is an object of this invention to provide a ratioless FET PLA in which both its AND and OR arrays are precharged.

One of the features of the invention is that it is self-timed and does not require multiple clock signals or additional logic between its AND and OR arrays in order to operate.

Another feature of the invention is that it operates without quiescent, i.e. direct current, power dissipation.

One of the advantages of the invention is that the FETs which comprise the arrays can be made of minimum size.

In accordance with the invention there is provided a logic array including a plurality of FETs connected in sets to perform AND functions and OR functions. Each FET has a gate and first and second conducting regions. The gates of the FETs serve as the inputs of the logic array. A separate column conductor for each AND set connects together one of the conducting regions of each FET in its associated AND set. A separate row conductor for each OR set connects together the first conducting region of each FET in its associated OR set. A common conductor connects together the second conducting region of all FETs performing an OR function. Means are included for precharging the column conductors, the row conductors and the common conductor in the OR array. Means are also included for selecting a particular combination of one or more AND sets for operation in conjunction with the operation of one or more OR sets in accordance with a particular function it is desired the array perform. The means for selecting includes delay means which delays the operation of all one or more OR sets associated with a particular function until the selected one or more AND sets associated with that function have all operated.

Figure 2:
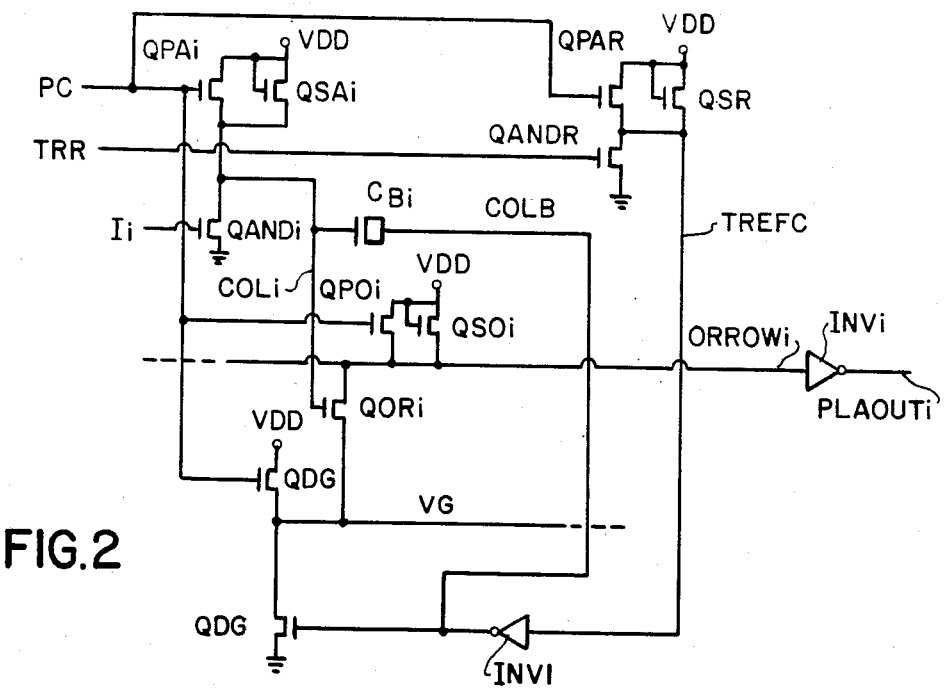
Figure 3:
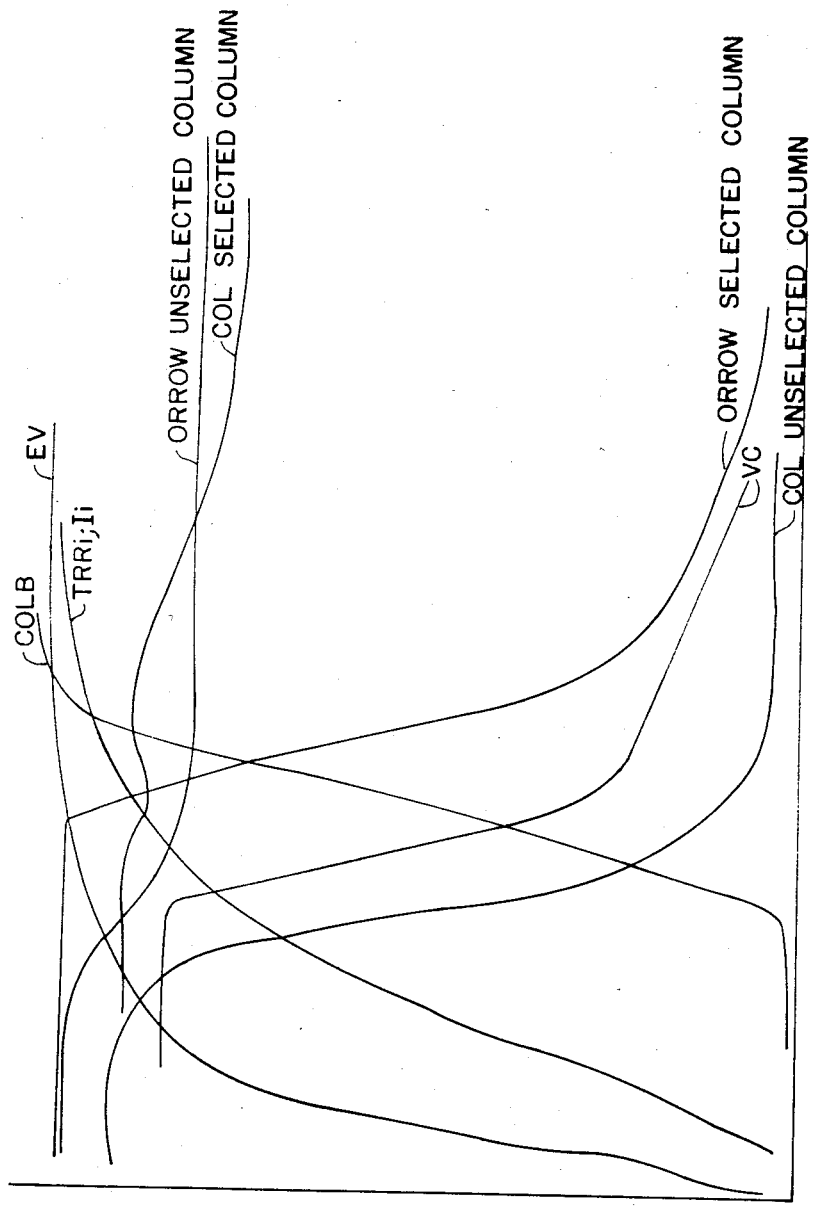

Other objects, features and advantages of the invention will become apparent to those skilled in the art from the following description when considered in conjunction with the appended claims and the accompanying drawing in which, FIG. 1 is a schematic diagram of an input circuit of the invention;

FIG. 2 is a schematic diagram of a representative AND and OR array of the invention; and FIG. 3 is a timing diagram of representative signals of the invention.

Referring to FIG. 1, there is shown a latch 11 which produces a binary 1 output from terminal Q or $\overline{Q}$ depending upon whether a binary 1 signal or a binary 0 is applied along line IN. A binary 1 signal from output Q causes transistors Q1, Q2 and Q3 to produce a binary 1 along line $I_i$ whenever a binary 1 signal appears along line EV. At the same time a binary 0 is applied from output $\overline{Q}$ and and transistors Q4, Q5 and Q6 produce a binary 0 along line $\overline{I}_i$. A binary 1 signal from output $\overline{Q}$ and a binary 0 from output Q when a binary 1 signal appears along line EV causes transistors Q1, Q2 and Q3 to provide a binary 0 along line $I_i$ and transistors Q4, Q5 and Q6 to produce a binary 1 along line $\overline{I}_i$. Binary 0s appear along both lines $I_i$ and $\overline{I}_i$ whenever a binary 0 appears on line EV. As is understood lines $I_i$ and $\overline{I}_i$ and other input lines are connected as inputs to the AND arrays.as representatively shown for line $I_i$ in FIG. 2.

Transistors Q1, Q2 and Q3 and transistors Q4, Q5 and Q6 comprise two AND gates whose inputs are the signal along line EV and the signals from outputs Q and $\overline{Q}$, respectively.

Shown in FIG. 2 is one FET $QAND_i$ which represents all of the FETs of one set of FETs which performs an AND function. In the disclosed embodiment each AND FET is an n-channel IGFET. Also shown in FIG. 2 is one FET $QOR_i$ which represents all of the FETs of one set of FETs connected to perform an OR function. In the disclosed embodiment each OR FET is an n-channel IGFET. As those skilled in the art understand in accordance with the functions it is desired that the PLA perform, the AND array will comprise one or more sets of FETs connected such as $QAND_i$. Each separate AND set's FETs are connected in parallel between ground and an associated column conductor such as $COL_i$. Each column conductor such as $COL_i$ connects together one of the conducting regions such as the drain of each FET such as $QAND_i$ in its associated AND set.

The OR array of the PLA comprises a plurality of FETs such as $QOR_i$ connected in parallel between associated row conductors such as $ORROW_i$ and common conductor VG. Each row conductor such as $ORROW_i$ connects together the first conducting region such as the drain of each FET such as $QOR_i$ in its associated OR set. Common conductor VG connects together the second conducting region such as the source of all FETs such as $QOR_i$ which perform an OR function in the PLA.

Transistors $QPA_i$, $QPO_i$, and QPG serve as means for precharging the column conductors such as $COL_i$, the row conductors such as $ORROW_i$ and the common conductor VG. Transistors such as $QPA_i$, $QSA_i$, $QPO_i$ and $QSO_i$ are provided for each column and each row in the PLA. Transistor QPAR provides a means for charging line TREFC to the voltage $V_{DD}$. Transistor QANDR provides a means for pulling line TREFC to ground upon the application of a binary 1 signal along line TRR. Transistors $QSA_i$, QSR and $QSO_i$ are high resistance devices used as sustaining transistors. If the cycle rate of the PLA were fast enough to refresh the storage nodes before any leakage occurs these last mentioned devices may be eliminated thereby further reducing the size of the PLA.

A separate column boost capacitor such as $C_{Bi}$ is provided for each column conductor in the array. Column boost line COLB connects to the bottom plate of all the column boost capacitors such as $CB_i$ of the PLA. Inverter INV1 applies a binary 1 signal to the gate of transistor QDG and along column boost line COLB to the column boost capacitors such as $C_{Bi}$ upon the application of a binary 0 along line TREFC. Output inverters such as $INV_i$ produce binary 1 signals along their associated output lines such as $PLAOUT_i$ upon the application of a binary 0 along their associated row conductors such as $ORROW_i$. A separate row conductor such as $ORROW_i$, an inverter such as $INV_i$ and an output line such as $PLAOUT_i$ is provided for each OR set of the PLA.

In operation prior to an evaluation mode, with line EV low, line PC goes high and causes column conductors such as $COL_i$, row conductors such as $ORROW_i$ and common conductor VG to approach $V_{DD}$ voltage. The precharging of common conductor VG allows OR array outputs such as $ORROW_i$ to be precharged even though gates of its associated OR array transistors such as $QOR_i$ are at a binary 1 level.

After the forementioned prechargings, line PC goes low and the evaluation mode can begin. To start an evaluation, line EV goes high (binary 1) causing line $I_i$ to go low (binary 0) provided a binary 0 is on output Q. (All selected AND transistors have binary 0's on their $I_i$ lines since binary 0's are applied to the inputs of their associated latches such as 11 of FIG. 1 to select their associated transistors.) At the same time that line $I_i$ goes low, line TRR goes high (binary 1) causing transistor QANDR to turn on. A binary 0 on line $I_i$ and all other selected input lines causes transistor $QAND_i$ and all other selected transistors in the AND array to turn off. In turning off the selected transistors in the AND array cause their column conductors such as $COL_i$ to remain high at approximately their precharge voltages. The column conductors for unselected transistors in the AND array are driven to ground (binary 0) by the fact that their unselected transistors are turned on.

At the same time, transistor QANDR drives line TREFC to ground after having been turned on by the binary 1 on line TRR. A binary 0 on line TREFC causes inverter INV1 to produce a binary 1 at its output. This produces a boosting voltage on both plates of the boost capacitors, such as $CB_i$, associated with each of the selected AND array columns such as $COL_i$. As a result the selected columns such as $COL_i$ are maintained at a high voltage (see FIG. 3). The unselected AND array columns at this time are at ground (binary 0) by reason of their transistors being on. These columns, therefore, will discharge any coupled voltage on the top plate of their associated boost capacitors and stay at binary 0.

When transistor QDG is turned on by the binary 1 at the output of inverter INV1, it drives common conductor VG to ground. This allows the OR FETS connected to selected columns to turn on and drive their associated conductors such as $ORROW_i$ to binary 0. Selected rows such as $ORROW_i$ by being driven to binary 0 cause their associated inverters such as $INV_i$ to produce binary 1's on the associated array output lines such as $PLAOUT_i$. The OR FETS associated with unselected columns are not turned on and consequently their row lines remain at their precharged voltages (see FIG. 3). As a consequence, the array outputs associated with such rows remain at binary 0.

As can be seen, the inputs to the array such as $I_i$ act as a selection means which enable the selection of a particular combination of one or more AND sets for operation in conjunction with the operation of one or more OR sets in accordance with a particular function it is desired that the array perform. Included in the selection means are a delay means comprising transistor QANDR, line TREFC, inverter INV1, boosting capacitors such as $C_{Bi}$, the precharge transistor QPG, common conductor VG and discharge transistor QDG. By designing the delay means to operate more slowly than any AND set in the PLA the delay means delays the operation of all of the OR sets associated with any particular function of the PLA until the selected one or more AND sets associated with that function have all operated.

It is to be understood by those skilled in the art that the disclosed array may be implemented in NMOS or CMOS.

Various modifications of the above arrangement will be evident to those skilled in the art. In one of these a delay circuit could be substituted for transistors QANDR, QPAR and QSR and inverter INV1. This delay circuit would be operated when the signal on line TRR goes high and after its delay would provide a boosting voltage on all selected boosting capacitors such as $C_{Bi}$.

From the foregoing it can be seen that there is no quiescent or direct current power dissipation in this PLA.

It is to be understood that the arrangement described herein is for illustrative purposes and is not to be considered restrictive.

What is claimed is:

1. A logic array including a plurality of FETs connected in sets to perform AND functions and OR functions, each FET having a gate and first and second conducting regions, the gates of said AND FETs serving as inputs for said logic array, a separate column conductor for each AND set connecting together one of the conducting regions of each FET in its associated and set, a separate row conductor for each OR set connecting together the first conducting region of each FET in its associated OR set, a common conductor connecting together second conducting regions of all FETs performing an OR function, precharging means precharging said column conductors, said row conductors and said common conductor, and selection means selecting a particular combination of one or more AND sets for operation in conjunction with the operation of one or more OR sets in accordance with a particular function it is desired that the array perform, said selection means connected to said common conductor including delay means delaying the operation of all said one or more OR sets associated with a particular function until said selected one or more AND sets associated with that function have all operated.

2. A logic array according to claim 1, wherein said delay means includes means for discharging said common conductor prior to the operation of said one or more OR sets.

3. A logic array according to claim 2, wherein said selection means includes a boosting capacitor connected to each column conductor, each said capacitor associated with a selected AND set being charged by the operation of said delay means to assure proper operation of the selected one or more AND sets.

4. A logic array according to claim 3, wherein said delay means includes an inverter and a pulldown transistor connected to said inverter, the operating time of said transistor and inverter being longer than the operating time of any AND set in the array.

5. A logic array according to claim 4, wherein said delay means includes an FET which is turned on by the operation of said inverter to connect said common conductor to ground.

6. A logic array according to claim 5, wherein during each operation all selected AND sets and all selected OR sets have their gates precharged whereby no quiescent or d.c. power is dissipated in the array during operation.

7. A logic array according to claim 6, wherein each of said AND FETs is an n-channel transistor.

8. A logic array according to claim 7, wherein each of said OR FETs is an n-channel transistor.

* * * * *